US008542038B2

(12) United States Patent
Huang et al.

(10) Patent No.: US 8,542,038 B2
(45) Date of Patent: Sep. 24, 2013

(54) SOURCE DRIVER AND RECEIVER THEREOF

(75) Inventors: Ren-Feng Huang, Kaohsiung (TW); Hui-Wen Miao, Hsinchu (TW); Ko-Yang Tso, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 18 days.

(21) Appl. No.: 13/441,211

(22) Filed: Apr. 6, 2012

(65) Prior Publication Data

US 2012/0256660 A1 Oct. 11, 2012

(30) Foreign Application Priority Data

Apr. 8, 2011 (TW) ................................ 100112179

(51) Int. Cl.
*H03K 3/00* (2006.01)

(52) U.S. Cl.
USPC ........... 327/108; 327/124; 327/563; 330/253; 330/261

(58) Field of Classification Search
None
See application file for complete search history.

(56) References Cited

U.S. PATENT DOCUMENTS 5,124,663 A * 6/1992 McEntarfer et al. .............. 330/9
7,248,115 B2 * 7/2007 Nishimura .................... 330/253
8,248,108 B2 * 8/2012 Santoro et al. .................. 327/63

* cited by examiner

*Primary Examiner* — An Luu

(57) ABSTRACT

A source driver and a receiver thereof are disclosed. A two-stage amplifier of the receiver includes a first-stage circuit and a second-stage circuit. The second-stage circuit includes a first switch, a second switch, a third switch, a first node, and a second node. The first switch is coupled between the first node and a ground end; the second switch is coupled between the second node and the ground end; the third switch is coupled between the first node and the second node. When the receiver wants to wake up from a power-saving mode to a normal operation mode, the first switch and the second switch are switched to the off-state according to a control signal at first; after a period of delay time, the third switch is also switched to the off-state according to a delayed control signal.

10 Claims, 3 Drawing Sheets

SOURCE DRIVER AND RECEIVER THEREOF

BACKGROUND OF THE INVENTION

1. Field of the Invention

The invention relates to a liquid crystal display; in particular, to a source driver and its receiver applied in the liquid crystal display using two grounded nodes in the second-stage circuit of the two-stage amplifier to shut down the two transistors coupled to the two nodes respectively, and a switch controlled by a delay control signal is disposed between the two nodes to achieve the aims of saving power and not increasing wake-up time.

2. Description of the Prior Art

In general, the source driver of the liquid crystal display includes a plurality of receivers arranged in series. When one of the receivers receives a start signal, it is the receiver's turn to receive gray level data. In order to save power, other receivers not receiving gray level data will usually enter into a power-saving mode. When the receiver almost finishes the receiving of gray level data, the receiver will output a wake-up signal to the next receiver to wake up the next receiver from the power-saving mode to start to receive the gray level data.

Please refer to FIG. 1. FIG. 1 illustrates a function block diagram of the receiver of the source driver in the prior art. As shown in FIG. 1, the receiver 1 of the source driver of the conventional liquid crystal display usually includes a structure of two-stage operational amplifier 10 having a first-stage amplifying circuit 100 and a second-stage amplifying circuit 102, and the open-circuit operation is used to amplify differential signals and convert them into single-ended signals. And then, the single-ended signals will be converted into Transistor-Transistor Logic (TTL) signals by a full-swing buffer 12, and the TTL signals will be outputted by a voltage output end 124 for pushing the next stage circuit.

When the receiver 1 of the conventional source driver is under the power-saving mode, the receiver 1 not only uses a transistor switch MP5 to cut off the current source 14 in the first-stage amplifying circuit 100, but also disposes a transistor switch MN5 for cutting off current to achieve the effect of saving power. However, under the normal operation mode, since the receiver 1 of the conventional source driver includes additional transistor switch MN5 having on-resistance, the swing of the amplified voltage signal Vop outputted by the two-stage operational amplifier 10 will become smaller due to the on-resistance of the transistor switch MN5.

SUMMARY OF THE INVENTION

Therefore, the invention provides a source driver and receiver thereof to solve the above-mentioned problems occurred in the prior arts.

A first embodiment of the invention is a source driver. In this embodiment, the source driver includes a plurality of receivers, and every receiver includes a two-stage amplifier. The two-stage amplifier includes a first switch, a second switch, a third switch, a first node, and a second node. The first switch is coupled between the first node and a ground end; the second switch is coupled between the second node and the ground end; the third switch is coupled between the first node and the second node. When the receiver wants to wake up from a power-saving mode to a normal operation mode, the first switch and the second switch are switched to the off-state according to a control signal at first; after a period of delay time, the third switch is also switched to the off-state according to a delayed control signal.

In practical applications, the receiver further includes a current input end, a first voltage input end, and a second voltage input end. The first-stage circuit includes a first transistor, a second transistor, and a third transistor. The third transistor is coupled among the current input end, the first transistor, and the second transistor; the first transistor is coupled to the first voltage input end; the second transistor is coupled to the second voltage input end. When the receiver enters into the power-saving mode from the normal operation mode, the third transistor cuts off the current inputted from the current input end according to the control signal.

The second-stage circuit further includes a fourth transistor and a fifth transistor, wherein the fourth transistor is coupled between the first node and the ground end; the fifth transistor is coupled between the second node and the ground end. During the period of delay time, the first switch and the second switch are switched to the off-state, and the third switch is still under the on-state to maintain the short state between the first node and the second node.

A second embodiment of the invention is a receiver. In this embodiment, the receiver is applied in a source driver. A two-stage amplifier of the receiver includes a first switch, a second switch, a third switch, a first node, and a second node. The first switch is coupled between the first node and a ground end; the second switch is coupled between the second node and the ground end; the third switch is coupled between the first node and the second node. When the receiver wants to wake up from a power-saving mode to a normal operation mode, the first switch and the second switch are switched to the off-state according to a control signal at first; after a period of delay time, the third switch is also switched to the off-state according to a delayed control signal.

Compared to the prior arts, the source driver and its receiver of the invention uses two grounded nodes in the second-stage circuit of the two-stage amplifier to make the two transistors coupled to the two nodes under off-state to save power. Since no current cutting-off transistor switch is disposed in the second-stage circuit of the source driver, under the normal state, the swing of the amplified voltage signal outputted by the two-stage operational amplifier will not become smaller due to the on-resistance of the transistor switch.

In addition, in order to avoid the longer wake-up time of the receiver switching from the power-saving mode to the normal operation mode through the above-mentioned way, a switch is disposed between the two nodes of the second-stage circuit in the receiver of the invention, and the switch is controlled by a delay control signal. When the power-saving mode is finished, the short state can be maintained between the two nodes for a period of time, and the two nodes can return to a suitable operating voltage along with the recovery of the bias current in this period of time, so that the source driver and its receiver of the invention can avoid the drawback of long wake-up time.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A first embodiment of the invention is a source driver. In this embodiment, the source driver is applied in a liquid crystal display and used for driving the source, but not limited to this.

Figure 1:
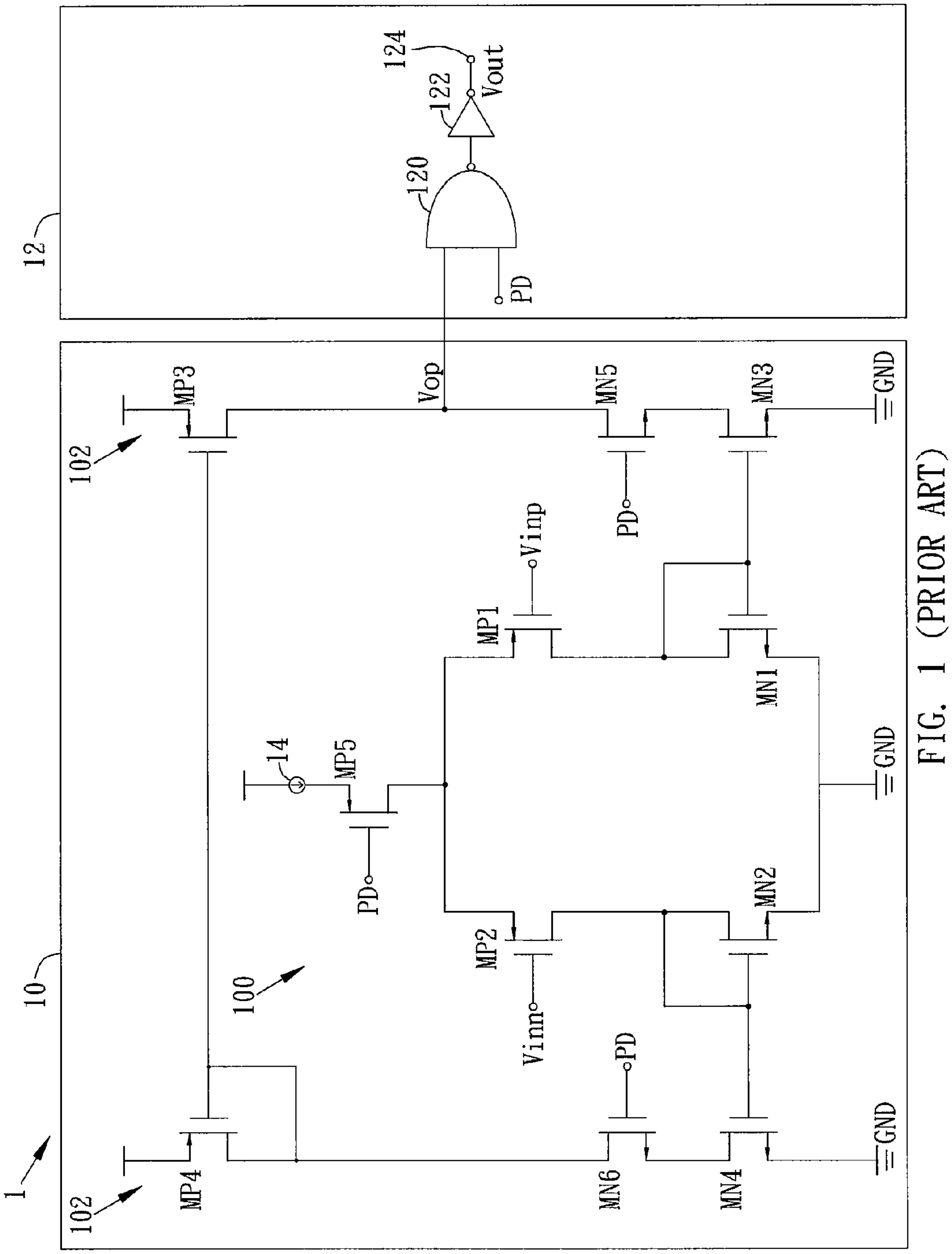
FIG. 1 (PRIOR ART)
FIG. 1 illustrates a function block diagram of the receiver of the source driver in the prior art.
Figure 2:
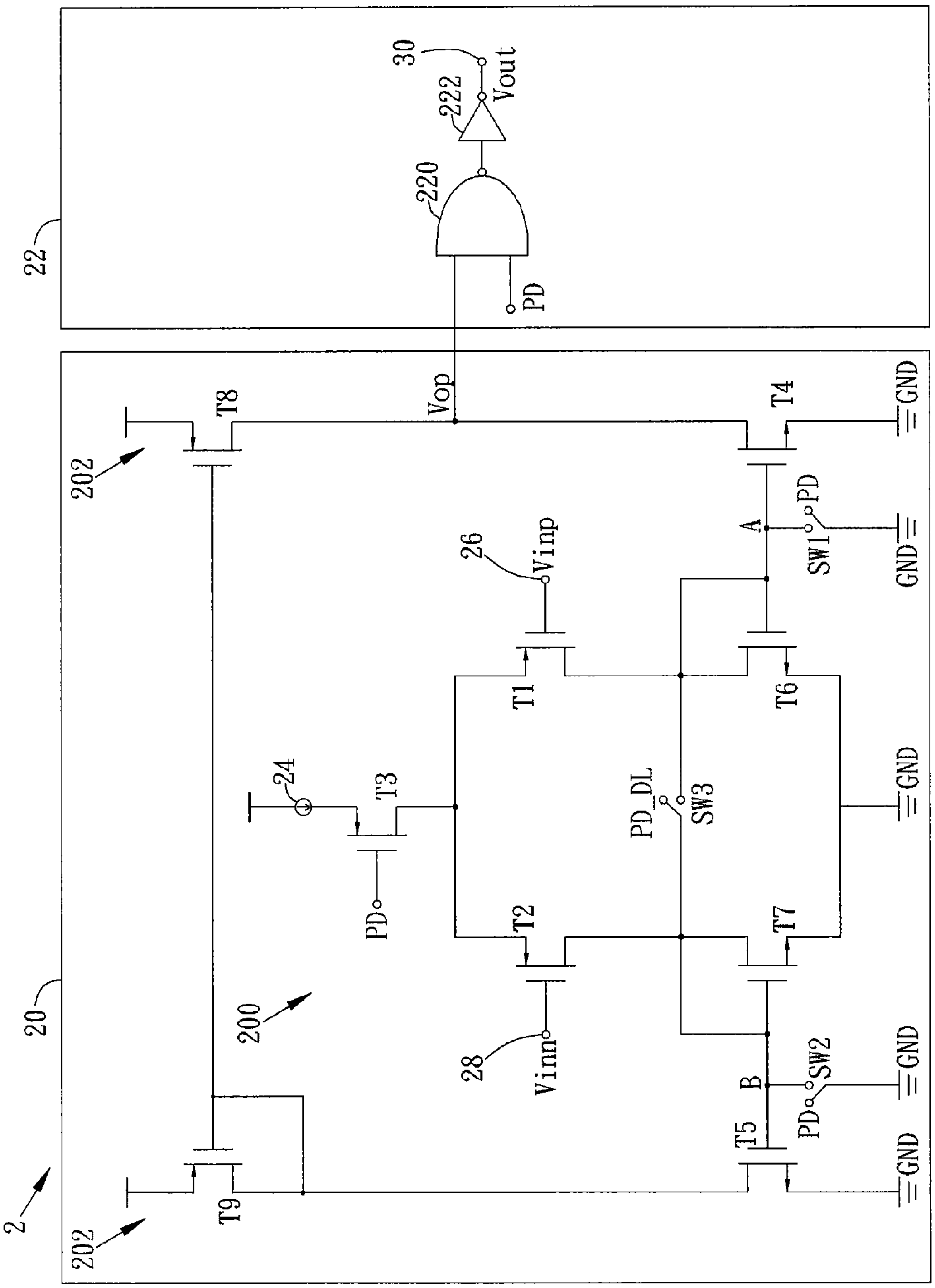
FIG. 2 illustrates a function block diagram of the receiver of the source driver in the invention.

Please refer to FIG. 2. FIG. 2 illustrates a function block diagram of the receiver of the source driver in the invention. As shown in FIG. 2, the receiver 2 of the source driver includes a two-stage amplifier 20, a buffer 22, a current input end 24, a first voltage input end 26, a second voltage input end 28, and a voltage output end 30. Wherein, the two-stage amplifier 20 and the buffer 22 are coupled; the current input end 24, the first voltage input end 26, and the second voltage input end 28 are coupled to the two-stage amplifier 20; the buffer 22 is coupled to the voltage output end 30.

In fact, the two-stage amplifier 20 can be a two-stage operational amplifier, but not limited to this; the buffer 22 can be a full-swing buffer, but also not limited to this.

In this embodiment, the two-stage amplifier 20 includes a first-stage circuit 200 and a second-stage circuit 202. As shown in FIG. 2, the first-stage circuit 200 includes a first transistor T1, a second transistor T2, and a third transistor T3. The third transistor T3 is coupled among the current input end 24, the first transistor T1, and the second transistor T2; the first transistor T1 is coupled to the first voltage input end 26, and the second transistor T2 is coupled to the second voltage input end 28.

In addition, the first-stage circuit 200 also includes a sixth transistor T6 and a seventh transistor T7. Wherein, the sixth transistor T6 is coupled between the first transistor T1 and the ground end GND, and the seventh transistor T7 is coupled between the second transistor T2 and the ground end GND.

The second-stage circuit 202 includes a first switch SW1, a second switch SW2, a third switch SW3, a first node A, a second node B, a fourth transistor T4, a fifth transistor T5, an eighth transistor T8, and a ninth transistor T9. Wherein, the first switch SW1 is coupled between the first node A and the ground end GND; the second switch SW2 is coupled between the second node B and the ground end GND; the third switch SW3 is coupled between the first node A and the second node B; the fourth transistor T4 is coupled between the first node A and the ground end GND; the fifth transistor T5 is coupled between the second node B and the ground end GND.

Next, the condition of the receiver 2 of the source driver switching between the normal operation mode and the power-saving mode will be introduced as follows.

If it is not the turn of the receiver 2 in the source driver to receive the gray level data, the source driver will control the receiver 2 to enter into the power-saving mode from the normal operation mode. At this time, in the two-stage amplifier 20 of the receiver 2, the third transistor T3 of the first-stage circuit 200 will cut off the current inputted from the current input end 24 according to a control signal PD under high-level state, and the first switch SW1, the second switch SW2, and the third switch SW3 of the second-stage circuit 202 will be under the on-state to make the first node A and the second node B be grounded, and the fourth transistor T4 and the fifth transistor T5 will be under the off-state to save power.

Figure 3:
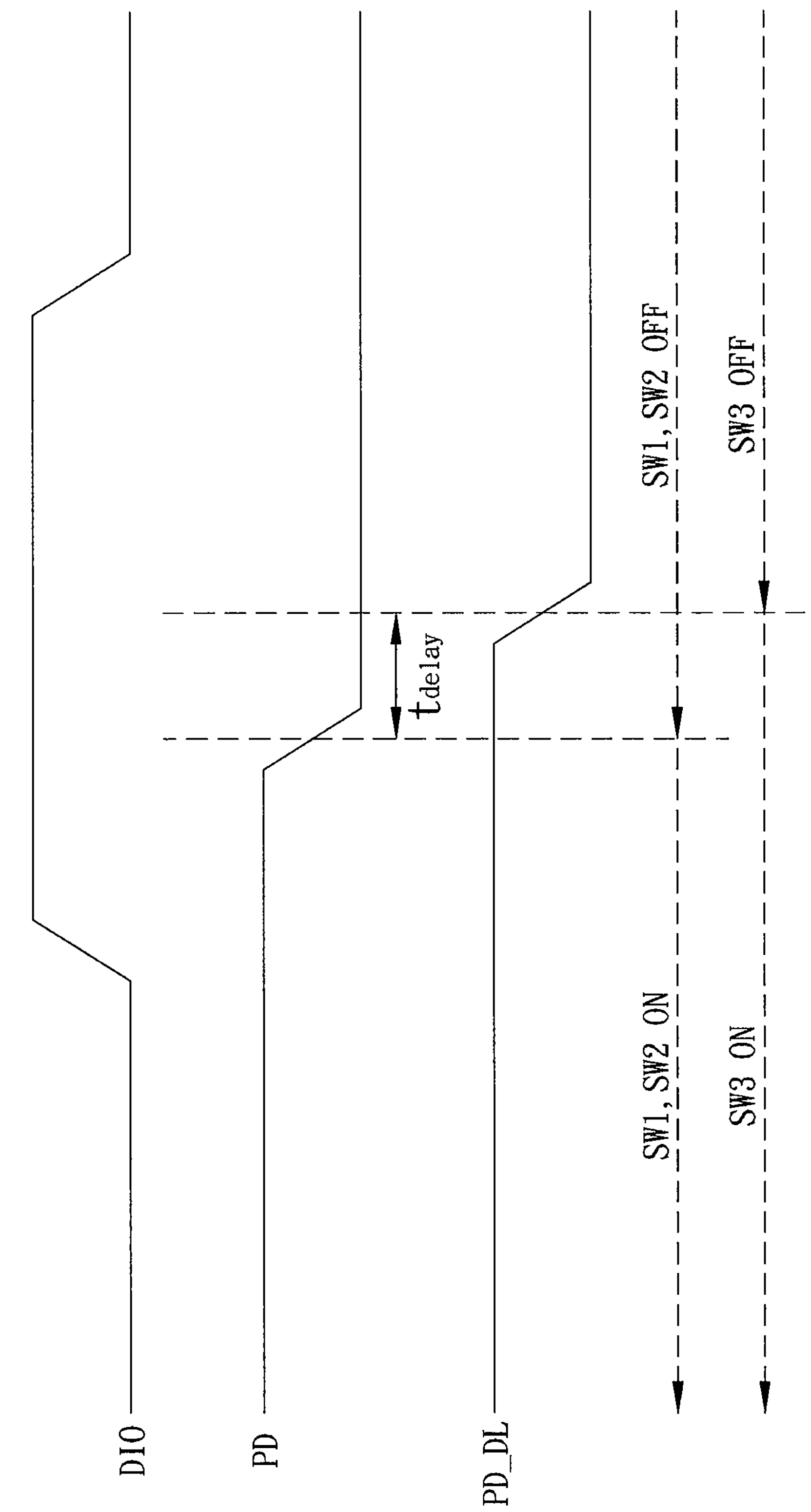
FIG. 3 illustrates a timing diagram of the receiver waking up from the power-saving mode and switching to the normal operation mode.

As shown in FIG. 3, if it is the turn of the receiver 2 in the source driver to receive the gray level data, the source driver will use a wake-up signal DIO to wake up the receiver 2 from the power-saving mode to be under the normal operation mode. At this time, in the two-stage amplifier 20 of the receiver 2, the third transistor T3 of the first-stage circuit 200 will allow the current inputted from the current input end 24 according to a control signal PD under low-level state, and the first switch SW1 and the second switch SW2 will be firstly switched to the off-state according to the control signal PD, after a period of delay time $t_{delay}$, the third switch SW3 will be switched to the on-state according to a delay control signal.

It should be noticed that in this period of delay time $t_{delay}$, the first switch SW1 and the second switch SW2 are under the off-state, but the third switch SW3 is under the on-state, therefore, a short-state can be maintained between the first node A and the second node B.

It is because the short-state can be maintained between the first node A and the second node B in this period of delay time $t_{delay}$, the first node A and the second node B can return to a suitable operating voltage along with the recovery of the bias current in this period of time $t_{delay}$, and the fourth transistor T4, the fifth transistor T5, the sixth transistor T6, and the seventh transistor T7 related to the first node A and the second node B can rapidly return to the saturation region from the cut-off region to avoid the long wake-up time of switching from the power-saving mode to the normal operation mode.

In this embodiment, the buffer 22 is coupled between the second-stage circuit 202 and the voltage output end 30. After the second-stage circuit 202 amplifies the differential signal and converts it into a single-ended signal, the buffer 22 will receive an amplified voltage signal Vop from the second-stage circuit 202, convert the amplified voltage signal Vop into an output voltage signal Vout, and then transmit it to the voltage output end 30. In fact, the output voltage signal Vout can be a Transistor-Transistor Logic (TTL) signal outputted by the voltage output end 30 for pushing the next stage circuit.

A second embodiment of the invention is a receiver. In this embodiment, the receiver is applied in a source driver of a liquid crystal display, but not limited to this. Please also refer to FIG. 2. The receiver 2 includes a two-stage amplifier 20 and a buffer 22. Wherein, the two-stage amplifier 20 includes a first two-stage amplifier 200 and a second-stage circuit 202. The second-stage circuit 202 includes a first switch SW1, a second switch SW2, a third switch SW3, a first node A, and a second node B. The first switch SW1 is coupled between the first node A and a ground end GND; the second switch SW2 is coupled between the second node B and the ground end GND; the third switch SW3 is coupled between the first node A and the second node B.

When the receiver 2 wants to wake up from a power-saving mode to a normal operation mode, the first switch SW1 and the second switch SW2 are switched to the off-state according to a control signal at first; after a period of delay time $t_{delay}$, the third switch SW3 is also switched to the off-state according to a delayed control signal, and its timing diagram is shown in FIG. 3.

In practical applications, the receiver 2 can further include a current input end 24, a first voltage input end 26, a second voltage input end 28, and a voltage output end 30. The first-stage circuit 200 can include a first transistor T1, a second transistor T2, and a third transistor T3. The third transistor T3 is coupled among the current input end 24, the first transistor T1, and the second transistor T2; the first transistor T1 is coupled to the first voltage input end 26; the second transistor T2 is coupled to the second voltage input end 28. When the receiver 2 enters into the power-saving mode from the normal operation mode, the third transistor T3 cuts off the current inputted from the current input end 24 according to the control signal.

In this embodiment, the buffer 22 is coupled between the second-stage circuit 202 and the voltage output end 30. The buffer 22 will receive an amplified voltage signal Vop from the second-stage circuit 202, convert the amplified voltage signal Vop into an output voltage signal Vout, and then transmit it to the voltage output end 30.

In addition, the second-stage circuit 202 further includes a fourth transistor T4 and a fifth transistor T5, wherein the fourth transistor T4 is coupled between the first node A and the ground end GND; the fifth transistor T5 is coupled between the second node B and the ground end GND. During the period of delay time $t_{delay}$, the first switch SW1 and the second switch SW2 are switched to the off-state, and the third switch SW3 is still under the on-state to maintain the short state between the first node A and the second node B.

Compared to the prior arts, the source driver and its receiver of the invention uses two grounded nodes in the second-stage circuit of the two-stage amplifier to make the two transistors coupled to the two nodes under off-state to save power. Since no current cutting-off transistor switch is disposed in the second-stage circuit of the source driver, under the normal state, the swing of the amplified voltage signal outputted by the two-stage operational amplifier will not become smaller due to the on-resistance of the transistor switch.

In addition, in order to avoid the longer wake-up time of the receiver switching from the power-saving mode to the normal operation mode through the above-mentioned way, a switch is disposed between the two nodes of the second-stage circuit in the receiver of the invention, and the switch is controlled by a delay control signal. When the power-saving mode is finished, the short state can be maintained between the two nodes for a period of time, and the two nodes can return to a suitable operating voltage along with the recovery of the bias current in this period of time, so that the source driver and its receiver of the invention can avoid the drawback of long wake-up time.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A source driver, comprising:

a receiver, comprising:

a two-stage amplifier, comprising:

a first-stage circuit; and a second-stage circuit, coupled to the first-stage circuit, the second-stage circuit comprising a first switch, a second switch, a third switch, a first node, and a second node; the first switch being coupled between the first node and a ground end; the second switch being coupled between the second node and the ground end; the third switch being coupled between the first node and the second node;

wherein when the receiver wants to wake up from a power-saving mode to a normal operation mode, the first switch and the second switch are switched to the off-state according to a control signal at first; after a period of delay time, the third switch is also switched to the off-state according to a delayed control signal.

2. The source driver of claim 1, wherein the receiver further comprises a current input end, a first voltage input end, and a second voltage input end, the first-stage circuit comprises a first transistor, a second transistor, and a third transistor, the third transistor is coupled among the current input end, the first transistor, and the second transistor, the first transistor is coupled to the first voltage input end, and the second transistor is coupled to the second voltage input end.

3. The source driver of claim 2, wherein when the receiver enters into the power-saving mode from the normal operation mode, the third transistor cuts off the current inputted from the current input end according to the control signal.

4. The source driver of claim 1, wherein the second-stage circuit further comprises a fourth transistor and a fifth transistor, the fourth transistor is coupled between the first node and the ground end, the fifth transistor is coupled between the second node and the ground end, during the period of delay time, the first switch and the second switch are switched to the off-state, and the third switch is still under the on-state to maintain the short state between the first node and the second node.

5. The source driver of claim 1, wherein the receiver further comprises:

a voltage output end; and a buffer, coupled between the second-stage circuit and the voltage output end, for receiving an amplified voltage signal from the second-stage circuit, converting the amplified voltage signal into an output voltage signal, and transmitting the output voltage signal to the voltage output end.

6. A receiver, applied in a source driver, the receiver comprising:

a two-stage amplifier, comprising:

a first-stage circuit; and a second-stage circuit, coupled to the first-stage circuit, the second-stage circuit comprising a first switch, a second switch, a third switch, a first node, and a second node; the first switch being coupled between the first node and a ground end; the second switch being coupled between the second node and the ground end; the third switch being coupled between the first node and the second node;

wherein when the receiver wants to wake up from a power-saving mode to a normal operation mode, the first switch and the second switch are switched to the off-state according to a control signal at first; after a period of delay time, the third switch is also switched to the off-state according to a delayed control signal.

7. The receiver of claim 6, further comprising a current input end, a first voltage input end, and a second voltage input end, wherein the first-stage circuit comprises a first transistor, a second transistor, and a third transistor, the third transistor is coupled among the current input end, the first transistor, and the second transistor, the first transistor is coupled to the first voltage input end, and the second transistor is coupled to the second voltage input end.

8. The receiver of claim 7, wherein when the receiver enters into the power-saving mode from the normal operation mode, the third transistor cuts off the current inputted from the current input end according to the control signal.

9. The receiver of claim 6, wherein the second-stage circuit further comprises a fourth transistor and a fifth transistor, the fourth transistor is coupled between the first node and the ground end, the fifth transistor is coupled between the second node and the ground end, during the period of delay time, the first switch and the second switch are switched to the off-state, and the third switch is still under the on-state to maintain the short state between the first node and the second node.

10. The receiver of claim 6, further comprising:

a voltage output end; and a buffer, coupled between the second-stage circuit and the voltage output end, for receiving an amplified voltage signal from the second-stage circuit, converting the amplified voltage signal into an output voltage signal, and transmitting the output voltage signal to the voltage output end.

* * * * *